United States Patent [19]

Suwa

[11] Patent Number: 4,657,379
[45] Date of Patent: Apr. 14, 1987

[54] PHOTOMASK AND EXPOSURE APPARATUS USING THE SAME

[75] Inventor: Kyoichi Suwa, Yokohama, Japan

[73] Assignee: Nippon Kogaku K. K., Tokyo, Japan

[21] Appl. No.: 729,970

[22] Filed: May 3, 1985

[30] Foreign Application Priority Data

May 11, 1984 [JP]  Japan .................................. 59-94052

[51] Int. Cl.$^4$ ............................................ G03B 27/42
[52] U.S. Cl. ........................................ 355/53; 355/43; 355/54
[58] Field of Search ............................. 355/43, 53, 54

[56] References Cited

U.S. PATENT DOCUMENTS

| 4,295,735 | 10/1981 | Lacombat et al. | 355/43 |
| 4,362,385 | 12/1982 | Lobach | 355/53 |
| 4,402,596 | 9/1983 | Kanatani | 355/43 |
| 4,408,875 | 10/1983 | Majima | 355/53 |

Primary Examiner—Monroe H. Hayes
Attorney, Agent, or Firm—Shapiro and Shapiro

[57] ABSTRACT

A photomask includes a pattern region including a predetermined original image pattern, a pair of mark regions which respectively include alignment marks located on a line crossing the pattern region and which are located at two sides of the pattern region, and a pair of light-shielding regions each of which has at least the same width as that of a corresponding one of the mark regions along a direction parallel to the line.

An exposure apparatus for sequentially exposing a plurality of regions on a photosensitive substrate by using a projection image on the photomask includes means for moving the photosensitive substrate and the photomask relative to each other such that images of marks for a current projection image are projected on a portion of a nonexposed region of a previous projection image, the portion being located next to a previous mark latent image and the nonexposed region being located between the latent image of the previous original image pattern and the latent image of the previous mark.

6 Claims, 9 Drawing Figures

PHOTOMASK AND EXPOSURE APPARATUS USING THE SAME

BACKGROUND OF THE INVENTION

1. Field of the Invention

The present invention relates to an exposure photomask used for manufacturing semiconductor devices such as ICs and LSIs, and an apparatus for exposing a semiconductor wafer with the photomask.

2. Description of the Prior Art

A number of reduction projection type steppers have recently been used as exposure apparatuses for performing micropattern transfer with high alignment precision in IC and LSI production lines. According to an exposure apparatus of this type, a semiconductor wafer coated with a photoresist film is exposed with a 1/5 or 1/10 image of a circuit pattern drawn on a reticle or a photomask which is reduced by a reduction projection lens. The reduced image of the circuit pattern is small with respect to the size of the wafer. For this reason, the wafer is placed on an X-Y stage and stepped by a predetermined pitch, thereby repeating projection of the reduced image. The exposure operation is referred to as a so-called "step-and-repeat" system, and the exposure apparatus of this type is called a stepper. In the manufacture of ICs and LSIs, in general, several circuit patterns must overlap and are subjected to exposure. The stepper comprises a means for accurately aligning a device region (to be referred to as a chip hereinafter) including a circuit pattern (i.e., an acutal element pattern) formed on the wafer with a new circuit pattern subjected to the overlap exposure. Several alignment techniques are considered. The most reliable technique is called a through-the-lens (TTL) system for aligning a reticle with a wafer through a projection lens. In particular, the die-by-die technique is performed as follows in the TTL system. Alignment marks are formed at a peripheral portion of the reticle between the circuit pattern and the edge thereof. The marks on the wafer are reverse projected on the reticle by the projection lens. Positional errors between the mark images and the marks on the reticle are detected so as to slightly move the wafer and the reticle relative to each other and eliminate the positional errors. According to the die-by-die technique, alignment can be performed in units of chips, thereby eliminating changes in size of elements which are caused by wafer processes (e.g., etching and diffusion) and hence obtaining highly precise alignment.

An observation apparatus is proposed as a TTL alignment means in U.S. Pat. No. 4,402,596. According to this apparatus, microopenings (i.e., the marks of the reticle) formed in the peripheral portion of the reticle are illuminated, images of the microopenings are formed by the projection lens on the wafer, and the aligning state between the microopening images and the marks on the wafer is observed above the reticle through the projection lens. In the observation apparatus, part of the microscope objective lens and a reflecting mirror are integrally movable. In this case, the microopenings in the reticle are formed in the peripheral portion of the reticle between the rectangular region (i.e., the pattern region) and the edge of the reticle. The marks on the wafers which are to be aligned with the microopening images are also formed in a peripheral portion of the wafer between the circuit pattern and the edge of the chip. When the microopenings and the marks of the wafer are observed by the observation apparatus, part of a metal member for holding the objective lens and the reflecting mirror extends to a position where part of the pattern region of the reticle is shielded. During exposure, the metal member must be withdrawn to a position where the pattern region is not shielded. This indicates that TTL die-by-die alignment requires a long time, thereby decreasing productivity (i.e., throughput) of ICs and LSIs. In addition, since the part (metal member) of the alignment means must be moved to shield or not to shield the circuit pattern, the mechanism is complicated as a whole. As a result, it is difficult to maintain uniform alignment with high precision.

SUMMARY OF THE INVENTION

It is an object of the present invention to eliminate the conventional drawbacks and provide an exposure mask for performing alignment with high precision without decreasing the throughput.

It is another object of the present invention to provide an exposure apparatus using the exposure mask described above.

According to an aspect of the present invention, there is provided a photomask including: a pattern region including a predetermined original image pattern; a pair of mark regions which respectively include alignment marks located on a line crossing the pattern region and which are located at two sides of the pattern region; and a pair of light-shielding regions each of which has at least the same width as that of a corresponding one of the mark regions along a direction parallel to the line.

According to another aspect of the present invention, there is provided an exposure apparatus for sequentially exposing a plurality of regions on a photosensitive substrate by using a projection image on the photomask, including: means for moving the photosensitive substrate and the photomask relative to each other such that images of marks for a current projection image are projected on a portion of a nonexposed region of a previous projection image, the portion being located next to a previous mark latent image and the nonexposed region being located between the latent image of the previous original image pattern and the latent image of the previous mark.

DESCRIPTION OF THE PREFERRED EMBODIMENTS

Figure 1:
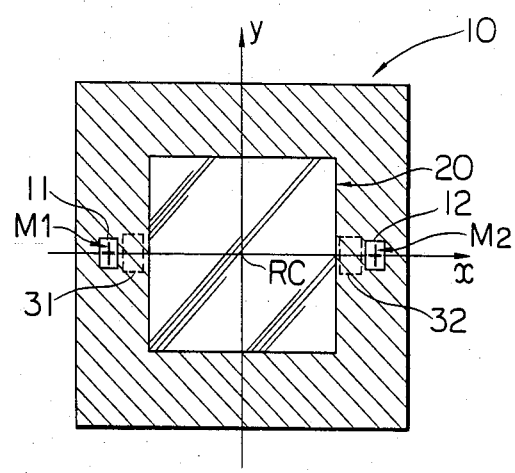
FIG. 1 is a plan view of a reticle as a photomask according to an embodiment of the present invention.
Figure 2:
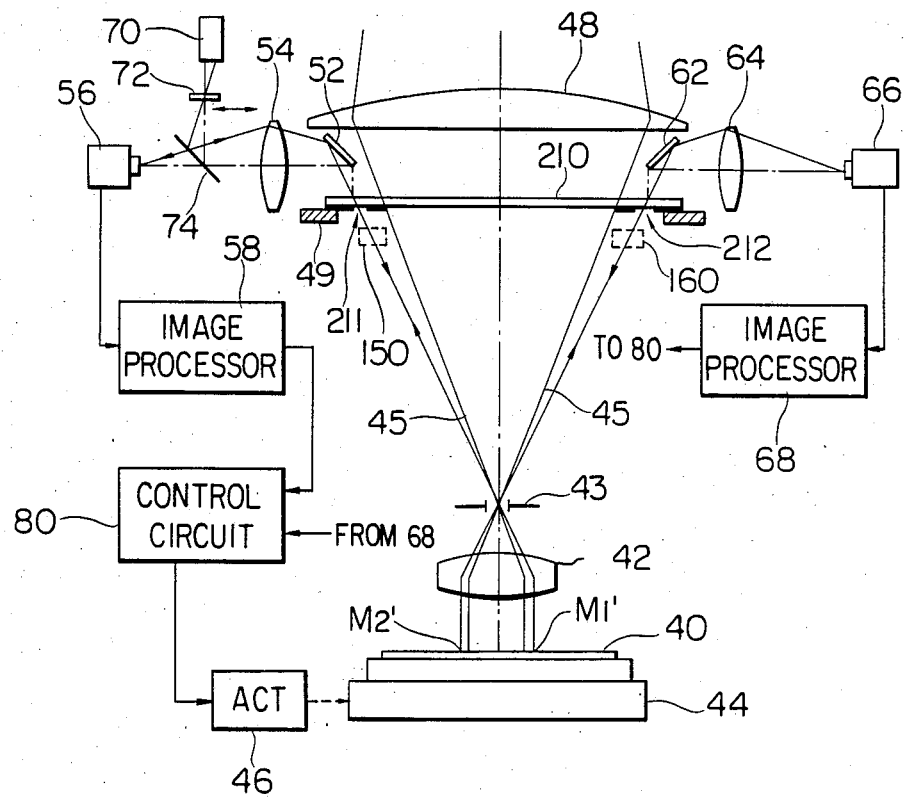
FIG. 2 is a schematic diagram showing a projection exposure apparatus using the reticle of FIG. 1 according to an embodiment of the present invention.

A reticle shown in FIG. 1 according to an embodiment of the present invention is used in an exposure apparatus of FIG. 2 which shows the schematic arrangement thereof.

Figure 3:
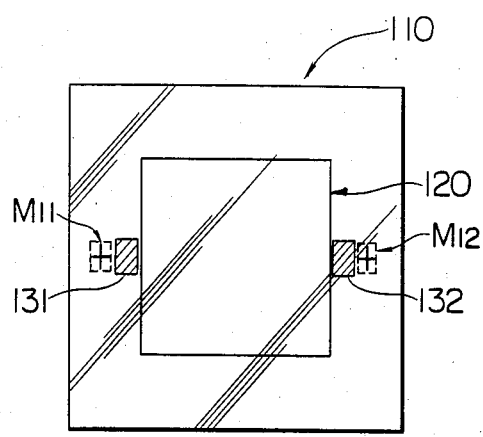
FIG. 3 is a plan view of a reticle used in the apparatus of FIG. 2 according to still another embodiment of the present invention.

A rectangular pattern region 20 having a desired circuit pattern is formed on a reticle 10. When the orthogonal (x-y) coordinate system having as the origin the center RC of the pattern region is given, cross marks M1 and M2 are formed at right and left positions at a predetermined distance from the center RC along the x-axis. In this embodiment, the marks M1 and M2 are formed inside rectangular mark regions 11 and 12, respectively. Each of the mark regions 11 and 12 can have a plurality of corresponding marks. A light-shielding layer of chromium is formed on the entire surface of the peripheral area of the pattern region 20 excluding the mark regions 11 and 12. The mark regions 11 and 12 serve as light-transmitting windows, respectively. The marks M1 and M2 are, therefore, made of a light-shielding material such as chromium in the mark regions 11 and 12, respectively. Light-shielding regions 31 and 32 are formed between the pattern region 20 and the mark region 11 and between the pattern region 20 and the mark region 12, respectively. Each of the light-shielding regions 31 and 32 has a width equal to or larger than that of the corresponding mark region along the x-axis. Since the mark regions are formed in the light-shielding layer in the reticle shown in FIG. 1, the light-shielding regions 31 and 32 are formed by the light-shielding layer. However, when the peripheral region of a reticle 110 (FIG. 3) outside a pattern region 120 comprises a light-transmitting region, light-shielding regions 131 and 132 are specifically formed between the pattern region 120 and the mark M11 and between the pattern region 120 and the mark M12, respectively.

Figure 4:
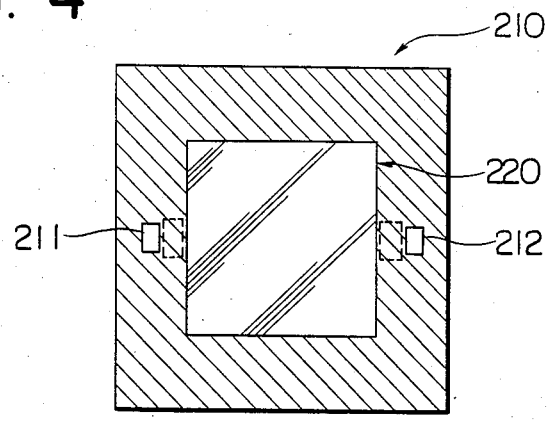
FIG. 4 is a plan view of a reticle according to still another embodiment of the present invention.

The above reticle is used to form a first layer circuit pattern on the wafer. The circuit pattern and the marks M11 and M12 are simultaneously transferred to the wafer. In a reticle 210 (FIG. 2) serving as a second or subsequent reticle which is aligned with a chip formed on the wafer, as shown in FIG. 4, rectangular openings 211 and 212 are formed at positions respectively corresponding to the marks M1 and M2. Each rectangular opening has a size suitable for an observation field of view of a microscope constituting the TTL alignment optical system.

Referring to FIG. 2, assume that a plurality of chips are formed on a wafer 40 in a matrix form by using the reticle 10 of FIG. 1. The reticle 210 is aligned with the chips located at the object side of a projection lens 42. A circuit pattern of the second layer is transferred to the wafer 40 located at the image side of the projection lens 42. The surface of the projection lens 42 which opposes the object can be nontelecentric, and the opposing surface can be telecentric. The wafer is placed on an x-y stage 44 and positioned by an actuator 46 at a predetermined position. The reticle 210 is uniformly illuminated by light emitted from an illumination optical system including a condenser lens 48. Image formation light 45 of the pattern region of the reticle is transmitted through the center of an entrance pupil 43 of the projection lens and reaches the wafer. The alignment openings 211 and 212 can be observed by a pair of alignment detection systems comprising reflecting mirrors 52 and 62, objective lenses 54 and 64, and image detectors 56 and 66 such as television cameras, respectively. In this case, the transferred marks M1' and M2' formed for each chip on exposure of the first reticle can also be simultaneously observed through the openings 211 and 212, respectively. One of the two alignment detection systems comprises a light source 70 for monitoring the opening 211 with light having the same wavelength as the exposure light, a shutter 72 for transmitting or shielding the illumination light from the light source 70, and a beam splitter 74 for guiding the illumination light allowed to pass by the shutter 72 to the opening 211 through a path between the image detector 56 and the objective lens 54. The other alignment detection system similarly has a light source, a shutter and a beam splitter.

Image signals from the image detectors 56 and 66 are supplied to image processors 58 and 68, respectively. The image processor 58 detects a relative positional error between the transferred mark M1' on the wafer and the opening 211. The image processor 68 detects a relative positional error between the transferred mark M2' and the opening 212. A control circuit 80 supplies a control signal to the actuator 46 to move the stage 44 so as to correct the positional errors detected by the image processors 58 and 68. It should be noted that the reticle 210 is placed on a reticle stage 49 and is aligned with the optical axis of the projection lens.

With the above arrangement, during wafer exposure by the reticle 210, the openings 211 and 212 are located distant from the pattern region so as not to cause the reflecting mirrors 52 and 62 to shield the image formation light 45. When the openings 211 and 212 are formed so as not to necessitate withdrawal of the reflecting mirrors 52 and 62 during exposure and alignment, the positions of the marks M1 and M2 of the reticle 10 are determined such that the distance between the edge of the pattern region of the reticle 210 and the corresponding opening 211 or 212 corresponds to that between the edge of one chip in the wafer and the corresponding transferred mark M1' or M2'.

The series of operations of the exposure apparatus with the arrangement described above will be described hereinafter. In this case, only the process will be described wherein the wafer is exposed using the circuit pattern of the first layer to form a chip (a one-shot circuit pattern is described as a chip irrespective of a single die or multidie system), and a circuit pattern of the second layer overlaps the chip and is subjected to exposure.

Figure 5:
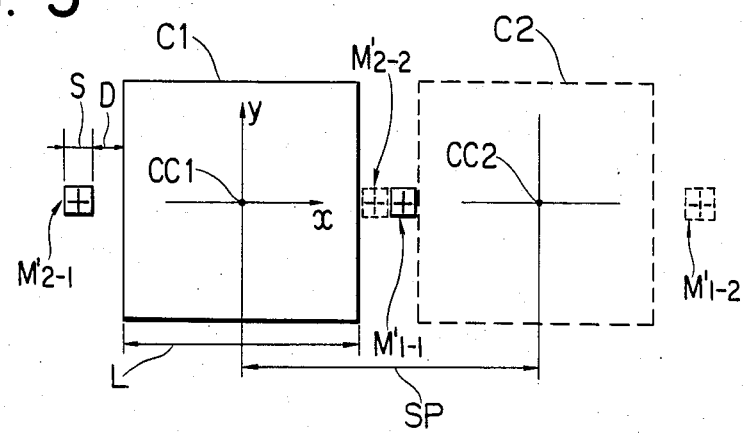
FIG. 5 is a plan view for explaining wafer exposure using the reticle shown in FIG. 1.

In order to form the circuit pattern of the first layer on the wafer, the reticle 10 shown in FIG. 1 is placed on the reticle stage 49. The reflecting mirrors 52 and 62 are withdrawn together with the objective lenses 54 and 64 so as not to allow the mirrors 52 and 62 to shield the marks M1 and M2. The exposure light irradiates the wafer through the reticle 10 every time the control circuit 80 and the actuator 46 move the stage 44 along the x- and y-axes by a predetermined pitch. In this case, the chips arranged on the wafer along the x-axis of the state 44 are formed such that two marks are transferred to a portion between every two adjacent chips. This alignment operation will be described with reference to FIG. 5. FIG. 5 shows an immediately preceding chip C1 and a current chip C2 next to the chip C1 along the x-axis.

When the center RC of the reticle is aligned with the optical axis of the projection lens 42 and the pattern region 20 is projected on the wafer, the chip C1 as a latent image corresponding to the pattern region and marks M1'-1 and M2'-1 as latent images which correspond to the marks M1 and M2 and which are located at positions distant from the center CC1 of the chip C1 by a predetermined distance, respectively, are formed on the photosensitive layer formed on the wafer. In this case, portions between the mark M2'-1 and the chip C1 and the mark M1'-1 and the chip C1 are nonexposed portions which do not receive exposure light due to the light-shielding regions 31 and 32 of the reticle 10.

The stage is stepped along the x-axis to form the chip C2 next to the chip C1.

In this case, the stage is positioned at an x-axis position where the projection image of the mark M2 is located in the nonexposed portion between the chip C1 and the mark M1'-1. When a second exposure is performed at this position, the chip C2 as a latent image corresponding to the pattern region 20 and marks M1'-2 and M2'-2 as latent images corresponding to the marks M1 and M2 are formed on the photosensitive layer.

When the x-axis chip size, i.e., the size of the projection image of the pattern region along the x-axis, the size of the projection image of each mark region along the x-axis, and the distance between the chip and the projection image of each mark region are defined as L, S and D, respectively, a stepping pitch SP along the x-axis is determined to be $SP \geq L+S+D$. Therefore, a scribing line formed between every two adjacent chips along the x-axis can be reduced to $S+D$.

In a conventional reticle wherein a light-shielding region having a predetermined width is not formed between the pattern region and each mark region, however, a width $2(S+D)$ is required as a scribing line along the x-axis so as to prevent overlapping of the projection images of the mark regions of every two adjacent chips. As a result, the total number of chips formed in the wafer is decreased.

The above exposure operation is repeated to form chips along the x-axis. When the chips are arranged along the y-axis, however, the above restriction is not imposed, so that the stage is stepped by a pitch so as not to overlap the chips along the y-axis. The wafer 40 exposed as described above is removed from the stage 44. The photosensitive layer is developed and subjected to subsequent known processes, thereby forming the circuit pattern of the first layer on the surface of the wafer.

Figure 6:
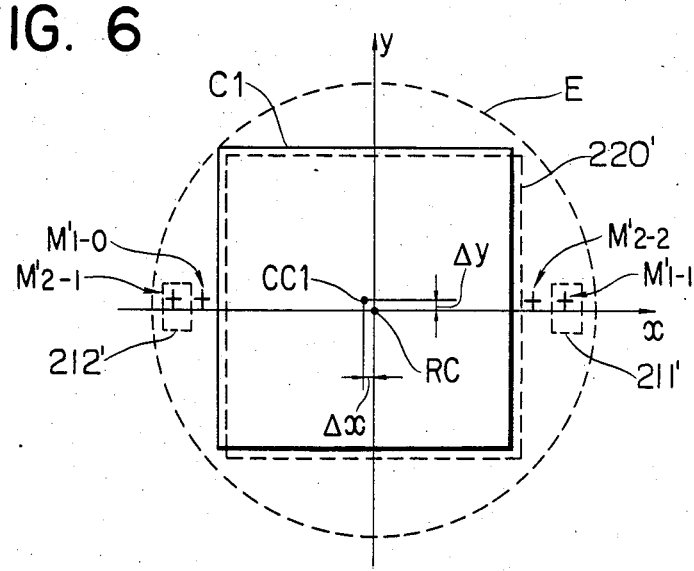
FIG. 6 is a plan view showing the relationship between the reticle projection image and the chip of the wafer.

Another photosensitive layer is coated on the wafer 40 which is again placed on the stage 44. In this case, the reticle 10 is replaced with the reticle 210 for the second layer. In order to transfer the circuit pattern of the second layer, the chip of the wafer must be aligned with a pattern region 220 of the reticle 210. The reflecting mirrors 52 and 62 and the objective lenses 54 and 64 are returned to the positions shown in FIG. 2 so as to locate the openings 211 and 212 to predetermined positions in the observation field of view, respectively. In this case, the shutter 72 is closed. A control signal is supplied from the control circuit 80 to the actuator 46 to move the stage 44 such that one chip of the wafer is substantially aligned with the projection image of the pattern region 220 of the reticle 210. The resultant alignment state is illustrated in FIG. 6. FIG. 6 shows the positional relationship among an image field E of the projection lens 42, a projection image 220' of the pattern region 220 which is projected when the center RC of the pattern region 220 is aligned with the optical axis of the projection lens, projection images 211' and 212' of the openings 211 and 212, and the chip C1 of the wafer and the corresponding marks. Referring to FIG. 6, the chip C1 is deviated by $\Delta x$ and $\Delta y$ along the x- and y-axes from the projection image 220'. In this case, the two marks M1'-1 and M2'-1 accompanying the chip C1 are deviated by $\Delta x$ and $\Delta y$ from the projection images 211' and 212', respectively. A mark M1'-0 accompanying a chip C0 to the left of the chip C1 is located between the mark M2'-1 and the chip C1. The mark M2'-2 accompanying the chip C2 to the right of the chip C1 is located between the mark M1'-1 and the chip C1.

In this state, the shutter 72 is opened to cause the image detectors 56 and 66 to detect an overlapping image of the opening 211 and the mark M1'-1 and an overlapping image of the opening 212 and the mark M2'-1, respectively. The image processor 58 detects a two-dimensional positional error ($\Delta x1$, $\Delta y1$) of the mark M1'-1 with respect to the opening 211. The image processor 68 detects a two-dimensional positional error ($\Delta x2$, $\Delta y2$) of the mark M2'-1 with respect to the opening 212. The control circuit 80 corrects the position of the stage 44 such that the positional errors ($\Delta x1$, $\Delta y1$) and ($\Delta x2$, $\Delta y2$) are set to predetermined values, e.g., zero. In this case, if the mark M2'-1 is spaced apart from the mark M1'-1 along the x-axis and the value $\Delta y1$ differs from the value $\Delta y2$, a relative rotational error is present between the projection image 220' and the chip C1. In addition, when the value $\Delta x1$ differs from the value $\Delta x2$, a change in wafer size due to wafer process or a magnification error of the projection lens is present. It is preferable that the stage position be corrected to optimally align the chip C1 with the projection image 220' in consideration of the above-mentioned errors.

When the correction operation described above is completed, the chip C1 can be accurately aligned with the projection image 220'. The exposure light irradiates the wafer through the reticle 210 to double print the projection image. In this case, the reflecting mirrors 52 and 62 and the objective lenses 54 and 64 of the alignment detection systems need not be withdrawn from the optical path of the exposure light. Therefore, exposure can be performed immediately after the wafer position is corrected by the alignment operation. The exposure apparatus of the present invention therefore need only short processing time.

When overlapping exposure for the chip C1 is completed, the control circuit 80 steps the stage 44 by the chip pitch along the x-axis, such that the chip C2 to the right of the chip C1 is substantially aligned with the projection image 220'. During this stepping time, the shutter 72 is closed. Alignment between the chip C2 and the projection image 220' is performed in a similar manner to that described above by detecting the relative deviations between the opening 212 and the mark M2'-2 and those between the opening 211 and the mark M1'-2. In this manner, overlapping exposure of the projection image is performed for all the chips on the wafer, thereby completing exposure of the single wafer.

In the above embodiment, the light source 70 of the alignment detection system emits illumination light which has the same wavelength as that of the exposure light. However, the illumination light can be a wavelength which does not sensitize the photosensitive layer. In this case, chromatic aberration imbalances the conjugated relationship between the openings 211 and 212 of the reticle and the marks M1' and M2' of the wafer, so that optical systems 150 and 160 comprising lenses, mirrors or prisms must be inserted between the reticle 210 and the projection lens 42, and in particular, immediately under the openings 211 and 212, to correct optical path lengths connecting the marks M1' and M2' and the openings 211 and 212.

The marks M1 and M2 can be located offset from the positions of FIG. 1 by a predetermined distance in the same direction along the y-axis. In addition, when the observation positions of the two alignment optical systems can be two-dimensionally changed on the reticle 210, updating of the alignment marks can be conveniently performed. More particularly, the observation position can be moved along a direction (x-axis) toward the center of the reticle 210 and a direction (y-axis) perpendicular to the x-axis. When the marks are updated, the alignment optical system is moved a predetermined distance substantially along the y-axis, and positions of the openings 211 and 212 and positions of the marks M1' and M2' can be updated. In particular, when the projection lens having a nontelecentric surface which opposes the object as shown in FIG. 2 is used, the illumination light at the openings 211 and 212 has angular characteristics. For this reason, the two alignment optical systems are preferably rotatable about the optical axis of the projection lens. When a chromatic aberration correction optical system is arranged, it must be rotatable together with the alignment optical systems about the optical axis. Furthermore, four alignment openings can be respectively formed in four sides of the pattern region of the reticle 210 to perform alignment by four alignment optical systems in accordance with the TTL system. In this case, alignment marks are formed on the wafer at right and left (x-axis) positions and upper and lower (y-axis) positions.

Figure 7:
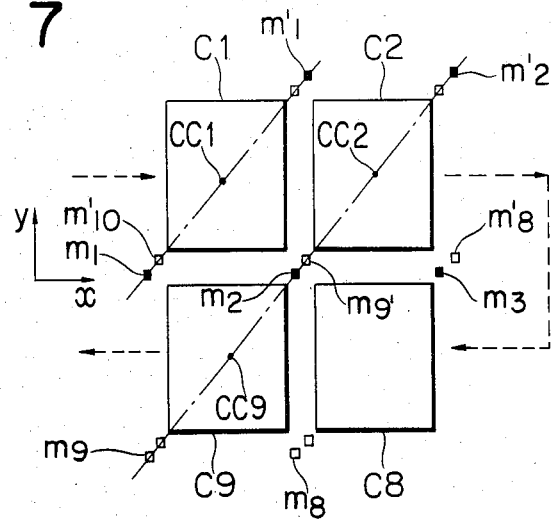
FIG. 7 is a plan view for explaining the wafer exposure using the reticle of FIG. 1.

In the above embodiment, two marks M1 and M2 are formed in the reticle 10 to align with the x-axis of the x-y coordinate system. These marks can be formed on a diagonal line of the pattern 20 which passes through the center RC of the reticle so as to obtain the same effect as in the above embodiment. In this case, the positions of the two alignment detection systems must be changed in accordance with the positions of the marks. In addition, the chip and the marks on the wafer are arranged in a positional relationship as shown in FIG. 7. When the chip C1 is printed, marks m1 and m1' are also printed on a line passing the center CC1 of the chip C1. When x-axis stepping is performed to print the chip C2, marks m2 and m2' are also printed on a line passing through the center CC2 of the chip C2. When one row of chips along the x-axis is printed and the next row is to be printed, stepping is performed so that a mark m9' of the marks m9 and m9' accompanying the chip C9 is printed between the chip C2 and the mark m2.

Figure 8:
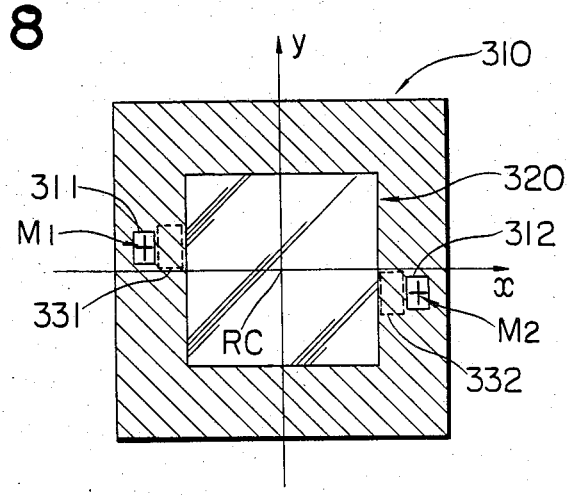
FIG. 8 is a plan view of a reticle according to still another embodiment of the present invention.

FIG. 8 shows a reticle according to still another embodiment of the present invention. A light-shielding layer is formed on the peripheral portion surrounding a pattern region 320 in the same manner as the reticle of FIG. 1. Light-shielding regions 331 and 332 are formed outside the pattern region, and mark regions 311 and 312 respectively having marks M1 and M2 are formed outside the light-shielding regions 331 and 332, respectively. The mark regions 311 and 312 are located at positions offset in the opposing directions of the x-axis, respectively.

Figure 9:
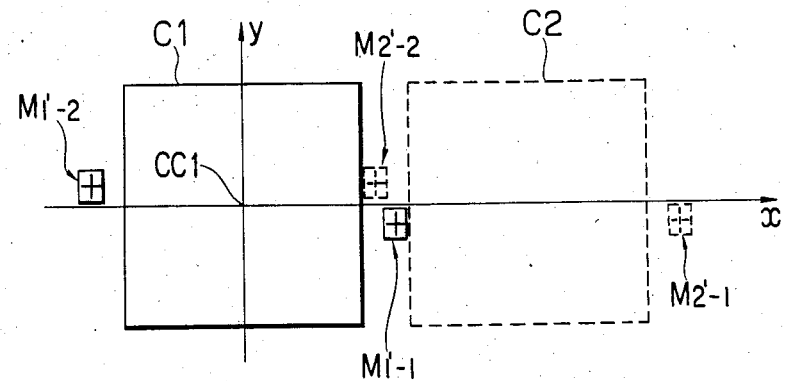
FIG. 9 is a plan view for explaining wafer exposure using the reticle of FIG. 8.

The relationship between each chip and the marks is illustrated in FIG. 9 when the circuit pattern of the first layer is formed on the wafer using the reticle 310. Although the projection image M1'-1 of the mark accompanying the chip C1 slightly overlaps the projection image M2'-2 of the mark accompanying the chip C2 along the x-axis, they are offset from each other along the y-axis. Therefore, the space of each of the light-shielding regions 331 and 332 of the reticle along the x-axis assures the x-axis width of corresponding one of the mark regions 311 and 312. Therefore, the y-axis size of the light-shielding regions can be smaller than that of the mark regions.

In the above embodiments, the marks M1 and M2 are formed of a light-shielding material in the transparent mask regions. However, the marks can be formed as transparent marks in the light-shielding layer. Again, the shape of the mask is not limited to a cross shape and can be a single linear pattern, a diffraction grating pattern having a plurality of regular small elements, or a single pattern of a geometric shape (e.g., rectangle and triangle) as long as the mark can be detected by alignment detection systems or an image processor of the exposure apparatus.

What is claimed is:

1. An apparatus for forming a plurality of identical images on a photosensitive substrate, comprising:
    a photomask having a pattern region which is formed on a surface of said photomask to locally transmit light therethrough and which has an original pattern formed thereon, first and second mark regions which locally transmit light therethrough and which are formed at opposite sides of said pattern region, said first and second mark regions being provided with first and second reference mark means therein, respectively, and first and second light-shielding regions which are formed between said pattern region and said first mark region and between said pattern region and said second mark region, respectively, said first light-shielding region having at least the same size as that of said second mark region and said second light-shielding region having at least the same size as that of said first mark region;
    moving means for moving said substrate and said photomask relative to each other;
    a projection optical system provided between said photomask and said substrate;
    radiating means for supplying a radiation beam to expose said substrate through said photomask and said projection optical system; and
    means for controlling said moving means and said radiating means so as to form an image of said original pattern on said substrate at each of a plurality of positions that constitute a matrix, each image of said original pattern having accompanying images of said first and second reference mark means, said images being formed so that a distance is provided between two of said original pattern images adjacent to each other along a first direction on said substrate, so that the image of the first reference mark means accompanying one of said two original pattern images and the image of the second reference mark means accompanying the other of said two original pattern images are located within said distance at discrete positions along said first direction and so that said image of said first reference mark means accompanying said one original pattern image is located between said other original pattern image and said image of said second reference mark means accompanying said other original pattern image.

2. An apparatus according to claim 1, wherein said controlling means controls said moving means and said radiating means to form successive original pattern images on said substrate along said one direction at a pitch substantially equal to L+S+D, where L represents the size of each original pattern image along said one direction, S represents the size of the image of each mark region along said one direction, and D represents the size of the image of each light-shielding region along said one direction.

3. An apparatus according to claim 2, wherein said first and second mark regions of said photomask are located on said photomask at opposite sides of said pattern region along said first direction and are offset along a direction perpendicular to said first direction.

4. An alignment apparatus for successively aligning a pattern region formed on a photomask with a plurality of identical chip patterns formed on a substrate, comprising:
a projection optical system provided between said photomask and said substrate;
first and second light-transmitting mark regions formed on said photomask at opposite sides of said pattern region, respectively;
first and second light-shielding regions formed on said photomask, said first light-shielding region being located between said pattern region and said first mark region and having at least the same size as said second mark region, and said second light-shielding region being located between said pattern region and said second mark region and having at least the same size as said first mark region;
first and second reference marks accompanying each of said chip patterns and formed on said substrate at opposite sides of each of said chip patterns, a distance being provided between two chip patterns that are adjacent to each other along a first direction on said substrate, the first reference mark accompanying one of said two chip patterns and the second reference mark accompanying the other of said two chip patterns being located within said distance at discrete positions along said first direction, said first reference mark accompanying said one chip pattern being located between said other chip pattern and said second reference mark accompanying said other chip pattern;
means for causing relative movement between said photomask and said substrate, whereby said chip patterns are successively opposed to said photomask through said projection optical system; and
means for aligning each opposed chip pattern with said photomask, including first alignment optical means for receiving a beam from the first reference mark accompanying the opposed chip pattern, through said projection optical system and through said first mark region of said photomask, and second alignment optical means for receiving a beam from the second reference mark accompanying the opposed chip pattern, through said projection optical system and through said second mark region of said photomask.

5. An apparatus according to claim 4, wherein said first and second reference marks are offset along a direction perpendicular to said first direction.

6. An apparatus for forming a plurality of identical chip patterns on a photosensitive substrate, comprising:
first and second photomasks each of which has a light-transmitting pattern region formed on a surface thereof and has an original chip pattern at said pattern region, first and second light-transmitting mark regions accompanying each pattern region and formed at opposite sides thereof, and first and second light-shielding regions located between each pattern region and the accompanying first mark region and between each pattern region and the accompanying second mark region, respectively, said first light-shielding region having at least the same size as that of said second mark region and said second light-shielding region having at least the same size as that of said first mark region;
means for supplying a light beam;
means for successively supporting said first and second photomasks on a predetermined plane intersecting said light beam;
a projection optical system provided between said predetermined plane and said substrate;
moving means for causing relative movement between said supporting means and said substrate;
means for producing a layer of said plurality of chip patterns on said substrate by the use of said light beam supplying means, said projection optical means, said moving means and said first photomask supported on said predetermined plane by said supporting means; a distance being provided between two chip patterns adjacent to each other along a first direction on said substrate, and first and second reference marks accompanying each chip pattern on said substrate, said first and second reference marks corresponding to said first and second mark regions of said first photomask, respectively, and being produced at opposite sides of each of said chip patterns on said substrate, respectively; said first reference mark accompanying one of said two chip patterns and said second reference mark accompanying the other of said two chip patterns being arranged within said distance at discrete positions along said first direction, and said first reference mark accompanying said one chip pattern being located between said other chip pattern and said second reference mark accompanying said other chip pattern; and
alignment optical means including first and second mirror members each of which is provided between said light beam supplying means and said predetermined plane, said first and second mirror members being provided outside of a light path of said light beam passing through said pattern region when said second photomask is supported by said supporting means and covering said first and second mark regions of said second photomask,
said alignment optical means further including means for emitting light illuminating said first and second reference marks and detection means for receiving light from said first and second reference marks through said projection optical system and through said first and second mark regions, and reflected by said first and second mirror members, respectively.

* * * * *